United States Patent [19]
Cooper

[11] 4,413,917
[45] Nov. 8, 1983

[54] RESISTANCE MEASURING SYSTEM

[75] Inventor: Neil A. Cooper, Birmingham, England

[73] Assignee: Lucas Industries Limited, Birmingham, England

[21] Appl. No.: 272,743

[22] Filed: Jun. 11, 1981

[30] Foreign Application Priority Data

Jun. 13, 1980 [GB] United Kingdom ............... 8019475

[51] Int. Cl.³ .............................................. G01K 7/20
[52] U.S. Cl. ................................. 374/173; 324/65 R; 374/183
[58] Field of Search ................. 374/183, 172, 173; 324/65 R, 65 P, 65 CP, 65 CR

[56] References Cited

U.S. PATENT DOCUMENTS 3,913,403 10/1975 Arcara ............................... 374/173

FOREIGN PATENT DOCUMENTS 2353812 12/1974 Fed. Rep. of Germany ...... 374/183
673866 7/1979 U.S.S.R. ............................. 374/183

Primary Examiner—E. R. Kazenske
Assistant Examiner—Denis E. Corr
Attorney, Agent, or Firm—Trexler, Bushnell & Wolters, Ltd.

[57] ABSTRACT

A temperature measuring system comprises a sensor which is connected to a supply rail through a first lead, and which may be selectively connected by a relay through a second lead or a third lead to the inverting input of an operational amplifier. The leads have different resistance values. The output of the amplifier is connected to its input through a resistor, and its non-inverting input is connected to the rail through a potential divider. The output of the amplifier is connected to a computer through a low pass filter and an A/D converter. In operation, the output voltage of the amplifier is first measured with the second lead connected to its inverting input and then measured again with the third lead connected. From these measurements the resistance of the sensor is calculated after calculating and hence eliminating the resistance of the leads. The sensed temperature can then be calculated from the resistance of the sensor.

5 Claims, 1 Drawing Figure

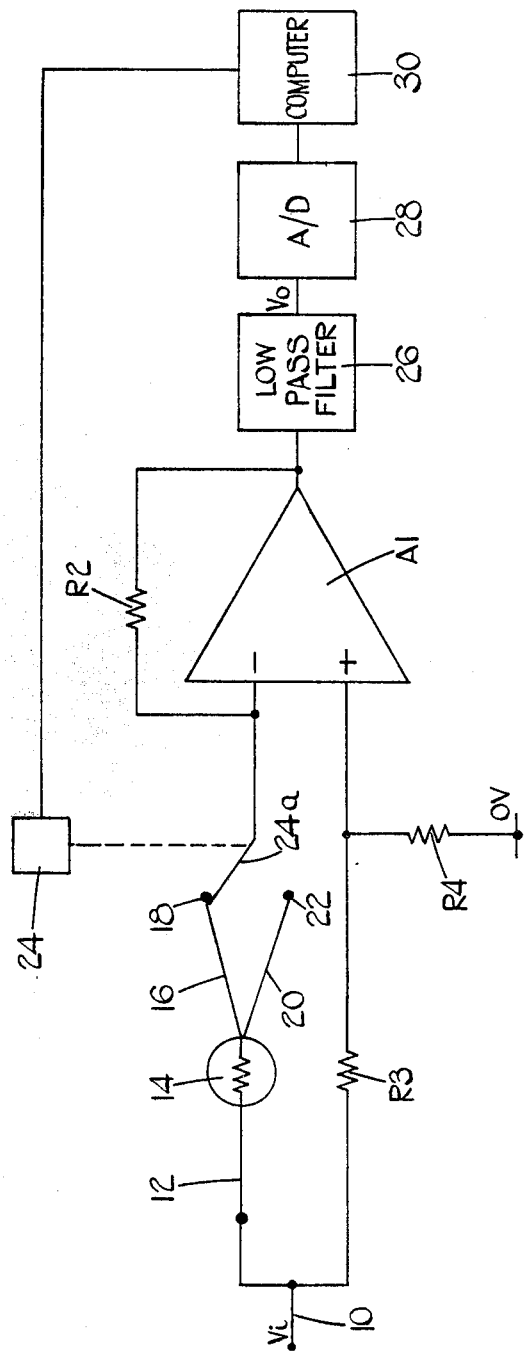

RESISTANCE MEASURING SYSTEM

This invention relates to a resistance measuring system which includes a sensor the resistance of which varies and a circuit for measuring the resistance of the sensor, and also to a method of measuring the resistance of such a sensor.

In such a system variations in the resistance of the two leads which connect respective terminals of the sensor to the measuring circuit cause errors in the measurement. In an attempt to compensate for the lead resistance variations it has been proposed to connect one terminal of the sensor to the measuring circuit through a third lead having a different resistance value to the other two leads but this does not provide full compensation for the lead resistance variations.

It is an object of this invention to reduce errors caused by lead resistance variations.

In accordance with one aspect of this invention, there is provided a resistance measuring system comprising a sensor the resistance of which varies, a first lead connected to one end of the sensor, a second lead connected to the other end of the sensor, a third lead of different resistance to the second lead connected to said other end, a circuit for measuring the resistance of the sensor, and switch means having a first state in which the sensor is connected to the measuring circuit through the first and second leads and a second state in which the sensor is connected to the measuring circuit through the first and third leads.

By providing the third lead and the switch means the resistance of the leads may be calculated and hence the error caused by lead resistance variation may be reduced.

The measuring circuit may include means for producing a first voltage corresponding to the combined resistance of the sensor and the first and second leads when the switch means are in said first state and a second voltage corresponding to the combined resistance of the sensor and the first and third leads when the switch means are in said second state.

In accordance with another aspect of this invention there is provided a method of measuring resistance comprising taking a sensor the resistance of which varies having a first lead connected to one end thereof, a second lead connected to the other end thereof, and a third lead of different resistance to the second lead connected to said other end thereof, measuring the combined resistance of the sensor and the first and second leads, measuring the combined resistance of the sensor and the first and third leads, and calculating the resistance of the sensor from the two combined resistance measurements.

This invention will now be described in more detail by way of example with reference to the accompanying drawing which is a circuit diagram of a temperature measuring system embodying the invention.

Referring now to the drawing the system comprises a supply rail 10 set to a voltage $V_i$ and connected through a first lead 12 having a resistance $r$ to one end of a Rosemount type 102EC 2BC platinum resistance temperature sensor 14 having a resistance $R_t$. The other end of the sensor 14 is connected through a second lead 16 having a resistance $r$ to a terminal 18 and through a third lead 20 having a resistance $kr$ to a terminal 22. The three leads 12, 16 and 20 are made of identical material so that they have identical temperature co-efficients and the value of $k$ is set to a non-unity value, for example 3.

The terminals 18 and 22 may be selectively connected through switch means in the form of a pole 24a of a relay 24 to the inverting input of an Analogue Devices Inc. type AD 517S operational amplifier A1, the non-inverting input of which is connected to the rail 10 through a resistor R3 and to a 0V rail through a resistor R4. The resistors R3 and R4 operate as a potential divider. Connected between the output of amplifier A1 and its non-inverting input there is provided a feedback resistor R2. The resistors R2, R3 and R4 are Vishay type S102C precision resistors.

The output of amplifier A1 is also connected to the input of a unity gain low pass second order Butterworth filter 26 having a cut-off frequency of 5 Hz and the output of filter 26 is connected to the input of an A/D converter 28. The output of the A/D converter 28 is connected to the input of a computer 30 which controls relay 24. The amplifier A1 together with the filter 26, A/D converter 28, computer 30 and resistors R2, R3 and R4 form a measuring circuit.

With the relay pole 24a in the position shown, the output voltage $V_o$ of filter 26 is given by:

$$V_o = -V_i \cdot \frac{R2}{R1}\left(1 - \frac{R4}{(R3+R4)} - \frac{R1}{R2} \cdot \frac{R4}{(R3+R4)}\right) \quad (1)$$

where $R1 = R_t + 2r$, and R2, R3 and R4 are respectively the resistance values of the resistors R2, R3 and R4.

The values of the resistors R2, R3 and R4 should be chosen so that the voltage $V_o$ lies within the operating range of the system over the temperature range sensed by the sensor 14.

The calculation of the temperature sensed by the sensor 14 will now be explained.

First, with the pole 24a in a first position so that the amplifier A1 is responsive to the combined resistances of the first lead 12, the second lead 16 and the sensor 14, the following calculation is made:

$$R1 = \frac{V_i\left(1 - \frac{R4}{(R3+R4)}\right) \cdot R2}{V_i \cdot \frac{R4}{(R3+R4)} - V_o} \quad (2)$$

where $R1 = R_t + r + r$
and $V_o$ = output voltage of filter 26.

Then, with the pole 24a in a second position so that the amplifier A1 is responsive to the combined resistance of the first lead 12, the third lead 20 and the sensor 14, the following calculation is made:

$$R1' = \frac{V_i\left(1 - \frac{R4}{(R3+R4)}\right) \cdot R2}{V_i \cdot \frac{R4}{(R3+R4)} - V_o'} \quad (3)$$

where $R1' = R_t + r + kr$
and $V_o'$ = output voltage of filter 26.

Then the value of $R_t$ is calculated as follows:

$$r = (R1' - R1)/(k-1) \quad (4)$$

and $$Rt = (R1 - 2r) \quad (5)$$

The temperature may then be calculated from the following law relating the temperature T and resistance Rt of sensor 14.

$$Rt = 130\left[1 + 0.003925\left\{T - 1.45\frac{(T-1)}{100} - B\frac{(T-1)}{100}\frac{(T)^3}{100}\right\}\right] \quad (6)$$

where B=0.1 for temperatures below 0° C.
and B=0.0 for temperatures above 0° C.

The computer 30 is programmed to make the calculations shown in equations 2, 3, 4, 5 and 6 and to calculate the temperature from the resistance value Rt.

It is estimated that the lead resistance is calculated with an accuracy of ±0.25 ohm and so the error caused by lead resistance variation is almost eliminated.

I claim:

1. A resistance measuring system comprising a sensor the resistance of which varies, a first lead connected to one end of the sensor, a second lead connected to the other end of the sensor, a third lead of different resistance to the second lead connected to said other end, a circuit for measuring the resistance of the sensor, and switch means having a first state in which the sensor is connected to the measuring circuit through the first and second leads and a second state in which the sensor is connected to the measuring circuit through the first and third leads, the measuring circuit including means for producing a first voltage corresponding to the combined resistance of the sensor and the first and second leads when the switch means are in said first state and a second voltage corresponding to the combined resistance of the sensor and the first and third leads when the switch means are in the second state.

2. A system as claimed in claim 1 in which the measuring circuit comprising an amplifier having an output, an inverting input and a non-inverting input, the output being connected to the inverting input through a resistor, the inverting input being connected to a supply rail through the first lead, the sensor and selectively through the second or third lead in accordance with the state of the switch means, and the non-inverting input being connected to the supply rail through a potential divider.

3. A system as claimed in claim 2 including a low pass filter, the input of which is connected to the output of the amplifier.

4. A system as claimed in any one of claims 1 to 3 in which the system is a temperature measuring system and in which the measuring circuit includes means for calculating the temperature sensed by the sensor from the first and second voltages.

5. A method of measuring resistance comprising taking a sensor the resistance of which varies having a first lead connected to one end thereof, a second lead connected to the other end thereof, and a third lead of different resistance to the second lead connected to said other end thereof, measuring the combined resistance of the sensor and the first and second leads, measuring the combined resistance of the sensor and the first and second leads, and calculating the resistance of the sensor from the two combined resistance measurements.

* * * * *

UNITED STATES PATENT AND TRADEMARK OFFICE
CERTIFICATE OF CORRECTION

PATENT NO. : 4,413,917

DATED : November 8, 1983

INVENTOR(S) : Neil Andrew Cooper

It is certified that error appears in the above-identified patent and that said Letters Patent is hereby corrected as shown below:

Column 4, lines 32-33, change "second" to --third--.

Signed and Sealed this

Tenth Day of April 1984

[SEAL]

Attest:

GERALD J. MOSSINGHOFF

Attesting Officer

Commissioner of Patents and Trademarks